United States Patent
Koschinsky et al.

(10) Patent No.: US 10,090,195 B2
(45) Date of Patent: Oct. 2, 2018

(54) METHOD INCLUDING A FORMATION OF A DIFFUSION BARRIER AND SEMICONDUCTOR STRUCTURE INCLUDING A DIFFUSION BARRIER

(71) Applicant: GLOBALFOUNDRIES Inc., Grand Cayman (KY)

(72) Inventors: Frank Koschinsky, Radebeul (DE); Bernd Hintze, Langerbrueck (DE); Heiko Weber, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/257,245

(22) Filed: Sep. 6, 2016

(65) Prior Publication Data

US 2017/0117179 A1    Apr. 27, 2017

Related U.S. Application Data

(60) Provisional application No. 62/244,253, filed on Oct. 21, 2015.

(51) Int. Cl.
*H01L 21/768* (2006.01)
*H01L 23/532* (2006.01)
*H01L 23/522* (2006.01)

(52) U.S. Cl.
CPC .. *H01L 21/76862* (2013.01); *H01L 21/76802* (2013.01); *H01L 21/76846* (2013.01); *H01L 21/76873* (2013.01); *H01L 21/76879* (2013.01); *H01L 23/5226* (2013.01); *H01L 23/53238* (2013.01)

(58) Field of Classification Search
CPC ......... H01L 21/76862; H01L 21/76879; H01L 21/76873; H01L 21/76846; H01L 23/5226; H01L 23/53238; H01L 21/76802
USPC ...................................................... 257/751
See application file for complete search history.

(56) References Cited

U.S. PATENT DOCUMENTS

| | | | |
|---|---|---|---|
| 6,465,867 B1 * | 10/2002 | Bernard | H01L 21/76843 257/506 |
| 2005/0098897 A1 * | 5/2005 | Edelstein | H01L 21/76846 257/762 |
| 2005/0208767 A1 * | 9/2005 | Ding | C23C 14/024 438/685 |

(Continued)

OTHER PUBLICATIONS

Wu et al., "Effects of Nitrogen Plasma Treatment on Tantalum Diffusion Barriers in Copper Metallization," Journal of the Electrochemical Society, 150:G83-89, 2003.

*Primary Examiner* — Marc Armand
*Assistant Examiner* — Sue Tang
(74) *Attorney, Agent, or Firm* — Amerson Law Firm, PLLC

(57) ABSTRACT

A method includes forming a diffusion barrier over a semiconductor structure. The formation of the diffusion barrier includes performing a first tantalum deposition process, the first tantalum deposition process forming a first tantalum layer over the semiconductor structure, performing a treatment of the first tantalum layer, and performing a second tantalum deposition process after the treatment of the first tantalum layer. The treatment modifies at least a portion of the first tantalum layer. The second tantalum deposition process forms a second tantalum layer over the first tantalum layer.

20 Claims, 8 Drawing Sheets

(56) References Cited

U.S. PATENT DOCUMENTS

2006/0199386 A1* 9/2006 Huang ................ H01L 21/3105
　　　　　　　　　　　　　　　　　438/687
2007/0166985 A1* 7/2007 Lee ................... H01L 21/76856
　　　　　　　　　　　　　　　　　438/597

* cited by examiner

METHOD INCLUDING A FORMATION OF A DIFFUSION BARRIER AND SEMICONDUCTOR STRUCTURE INCLUDING A DIFFUSION BARRIER

BACKGROUND OF THE INVENTION

1. Field of the Invention

Generally, the present disclosure relates to integrated circuits and methods for the formation thereof, and, more particularly, to integrated circuits including diffusion barriers and methods for the formation thereof.

2. Description of the Related Art

Integrated circuits typically include a large number of circuit elements which include, in particular, field effect transistors. The circuit elements in an integrated circuit may be electrically connected by means of electrically conductive metal lines formed in a dielectric material, for example, by means of damascene techniques. The electrically conductive metal lines may be provided in a plurality of interconnect layers that are stacked on top of each other above a substrate in and on which the circuit elements are formed. Metal lines in different interconnect layers may be electrically connected with each other by means of contact vias that are filled with metal.

For providing a relatively small resistivity of the electrically conductive metal lines, which may allow a reduction of a cross-sectional area of the electrically conductive metal lines, the electrically conductive metal lines may be formed of a metal including copper, for example, substantially pure copper or an alloy including copper and one or more other elements such as, for example, aluminum. However, a diffusion of copper from the electrically conductive metal lines into other portions of the integrated circuit can adversely affect the functionality of the integrated circuit. In particular, a diffusion of copper into semiconductor materials such as silicon can adversely affect the semiconductor properties thereof.

In order to substantially avoid or at least reduce the diffusion of copper, diffusion barriers may be provided between the electrically conductive material including copper and the dielectric material wherein the electrically conductive metal lines are provided. Wu et al., "Effects of Nitrogen Plasma Treatment on Tantalum Diffusion Barriers in Copper Metallization," *Journal of the Electrochemical Society*, 150(2), G83-G89, 2003, discloses diffusion barrier layers that are formed of tantalum, tantalum nitride or nitrogen plasma treated tantalum.

In other examples, diffusion barriers may include a layer of tantalum, which may be provided on a layer of tantalum nitride. For forming such diffusion barriers, the tantalum nitride layer may be deposited, for example, by means of a technique of physical vapor deposition, such as sputtering. Thereafter, substantially pure tantalum may be deposited on the tantalum nitride layer by means of physical vapor deposition.

Tantalum deposited by means of physical vapor deposition can exist in two different crystal structures, which are denoted as alpha phase tantalum and as beta phase tantalum. In the alpha phase, the tantalum has substantially a body centered cubic (bcc) crystal structure and a relatively small electrical resistivity in a range from about 15 $\mu\Omega\cdot$cm to about 60 $\mu\Omega\cdot$cm. In the beta phase, the tantalum has substantially a tetragonal crystal structure and a relatively high resistivity in a range from about 170 $\mu\Omega\cdot$cm to about 210 $\mu\Omega\cdot$cm. When depositing a tantalum layer by means of physical vapor deposition, it may be desirable to use a relatively low deposition temperature to reduce the thermal budget required for the tantalum deposition process. Moreover, it may be desirable to use a relatively high ion flux and a relatively high ion energy to accelerate the deposition of the tantalum layer. Under such conditions of the deposition process, a tantalum layer that is substantially formed of beta phase tantalum is typically obtained so that the tantalum layer has a relatively high resistivity.

In typical diffusion barriers including a layer of tantalum nitride and a layer of tantalum, the tantalum layer is typically from about two times to about three times thicker than the tantalum nitride layer. Therefore, the tantalum layer can contribute significantly to the electrical resistance of the diffusion barrier. Since the diffusion barrier is typically provided at the bottom of contact vias, where an electrical contact between the electrically conductive material in the via and the electrically conductive material in an electrically conductive line below the via is made, diffusion barriers including beta phase tantalum can significantly contribute to the resistance of contact vias. Additionally, portions of the diffusion barrier at bottom and sidewall surfaces of trenches filled with an electrically conductive material can increase the electrical resistance of electrically conductive lines when the diffusion barrier includes a substantial amount of beta phase tantalum. Furthermore, known diffusion barriers including a layer of tantalum nitride may have a relatively small step coverage.

In view of the above-mentioned issues, the present disclosure provides methods and semiconductor structures that may help to substantially overcome or at least reduce the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes forming a diffusion barrier over a semiconductor structure. The formation of the diffusion barrier includes performing a first tantalum deposition process, the first tantalum deposition process forming a first tantalum layer over the semiconductor structure, performing a treatment of the first tantalum layer, and performing a second tantalum deposition process after the treatment of the first tantalum layer. The treatment modifies at least a portion of the first tantalum layer. The second tantalum deposition process forms a second tantalum layer over the first tantalum layer.

Another illustrative method disclosed herein includes forming a diffusion barrier over a semiconductor structure. The formation of the diffusion barrier includes depositing a first tantalum nitride layer over the semiconductor structure and depositing a first tantalum layer over the first tantalum nitride layer. The deposition of the first tantalum nitride layer includes performing an atomic layer deposition process that deposits tantalum nitride.

An illustrative semiconductor structure disclosed herein includes a diffusion barrier. The diffusion barrier includes a first tantalum layer and a second tantalum layer over the first tantalum layer. At least a portion of the second tantalum layer includes alpha phase tantalum. A proportion of alpha phase tantalum in the second tantalum layer is greater than a proportion of alpha phase tantalum in the first tantalum layer.

BRIEF DESCRIPTION OF THE DRAWINGS

The disclosure may be understood by reference to the following description taken in conjunction with the accompanying drawings, in which like reference numerals identify like elements, and in which:

FIG. 3b shows a schematic cross-sectional view of a portion of the semiconductor structure at the stage of the method shown in FIG. 3a;

FIGS. 4b and 4c show schematic cross-sectional views of portions of the semiconductor structure at the stage of the method illustrated in FIG. 4a;

Figure 1:
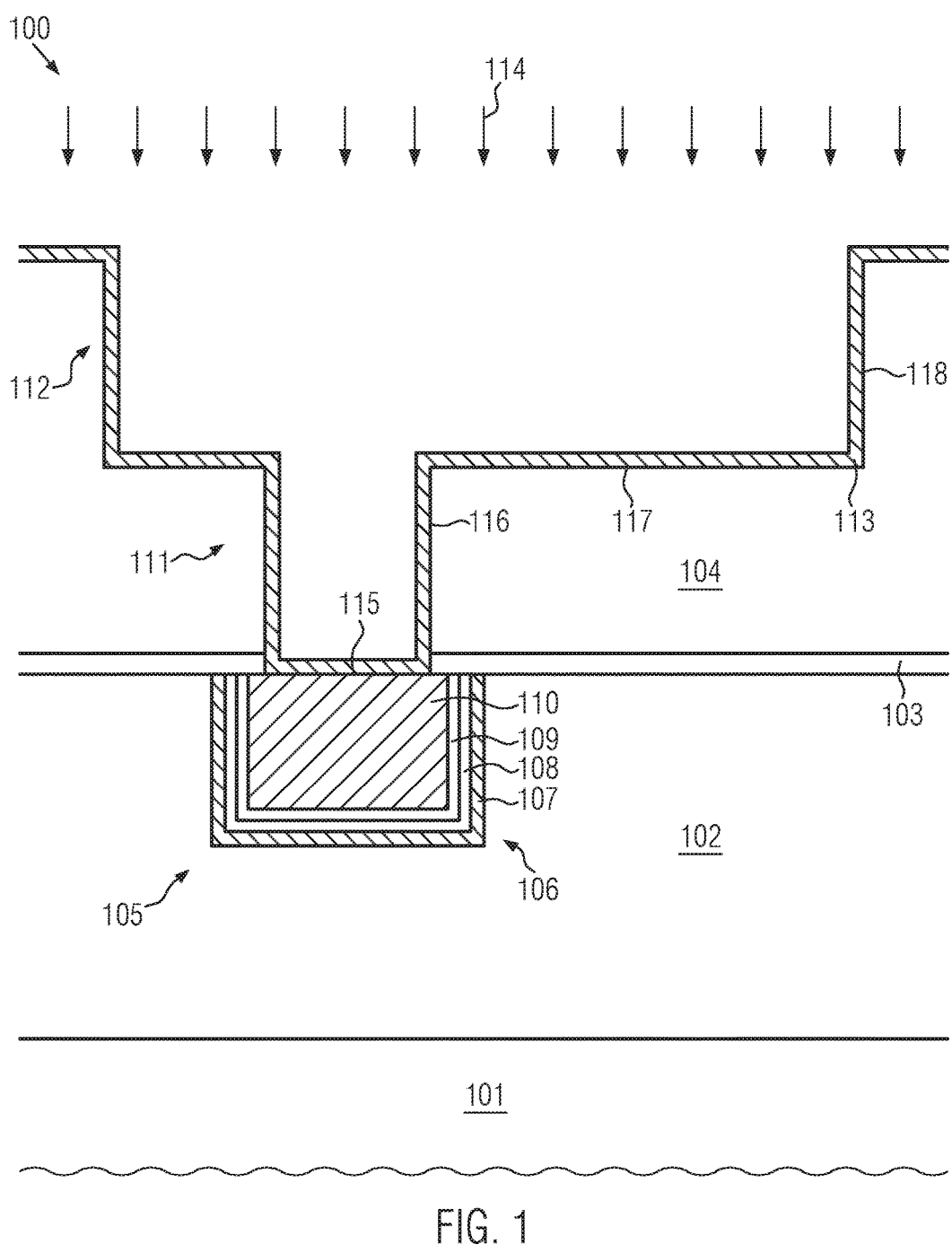
FIGS. 1, 2, 3a, 4a and 5 show schematic cross-sectional views of a semiconductor structure in stages of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In embodiments disclosed herein, a diffusion barrier including a tantalum nitride layer and a tantalum layer may be formed. The tantalum nitride layer may be formed by means of a physical vapor deposition of tantalum nitride and an additional deposition of tantalum nitride by means of atomic layer deposition that is performed after the physical vapor deposition. Experiments that were performed by the inventors have shown that tantalum nitride formed by means of an atomic layer deposition process may have a higher nitrogen content than tantalum nitride formed by means of a physical vapor deposition process. After depositing the tantalum layer over the tantalum nitride layer formed by means of atomic layer deposition, nitrogen can diffuse into the tantalum and can promote the formation of alpha phase tantalum. In some embodiments, the atomic layer deposition process deposits tantalum nitride directly on the tantalum nitride deposited by means of physical vapor deposition. In other embodiments, an additional tantalum layer may be provided between the tantalum nitride layer formed by means of physical vapor deposition and the tantalum nitride layer formed by means of atomic layer deposition.

In further embodiments, a deposition of tantalum by means of physical vapor deposition may be divided into separate portions. After each tantalum deposition, an inductively coupled plasma including ionized nitrogen can be applied to the wafer having freshly deposited tantalum thereon. In some embodiments, the inductively coupled nitrogen plasma may be applied in situ in a semiconductor processing device that is used for the physical vapor deposition of tantalum without requiring any hardware modification. The inductively coupled nitrogen plasma can provide a diffusion of nitrogen into the tantalum deposited by the subsequent physical vapor deposition process, wherein the nitrogen can promote the formation of alpha phase tantalum.

In other embodiments, a flow of substantially non-ionized nitrogen gas can be applied to the freshly deposited tantalum instead of the inductively coupled nitrogen plasma. The flow of nitrogen gas can also provide a diffusion of nitrogen into tantalum, wherein, however, the nitrogen diffusion provided by a nitrogen plasma is typically faster, deeper and stronger.

In further embodiments, a chemical compound including nitrogen such as, for example, ammonia may be used instead of nitrogen for forming an inductively coupled plasma. In still further embodiments, a mixture of nitrogen and argon and/or substantially pure argon may be used.

Without wishing to be bound by any theory, the promotion of the formation of alpha phase tantalum by the application of an inductively coupled plasma might be explainable by plasma activated tantalum boundary migration.

In addition to promoting the formation of alpha phase tantalum, techniques as disclosed herein may allow an improvement of the step coverage of a diffusion barrier. An increased step coverage can be obtained both by applying an inductively coupled nitrogen plasma and by performing an additional tantalum nitride atomic layer deposition process as described above.

Techniques as described herein can enhance a robustness of diffusion barriers, and they can improve a reliability performance thereof.

FIG. 1 shows a schematic cross-sectional view of a semiconductor structure 100 according to an embodiment at a stage of a method of manufacturing a semiconductor structure according to an embodiment. The semiconductor structure 100 includes a substrate 101. The substrate 101 may include a semiconductor wafer, for example, a bulk semiconductor wafer that is formed of a semiconductor material such as, for example, silicon. Alternatively, the substrate 101 may include a semiconductor-on-insulator (SOI) wafer that includes a layer of a semiconductor material such as, for example, silicon that is formed above a support wafer, which may be a silicon wafer, and is separated therefrom by a layer of an electrically insulating material such as, for example, silicon dioxide.

At the stage of the method shown in FIG. 1, the substrate 101 may additionally include field effect transistors and other circuit elements such as, for example, capacitors, resistors and diodes (not shown), which are formed at the semiconductor material of the wafer. Additionally, the substrate 101 may include an interlayer dielectric layer having contact holes filled with an electrically conductive material and providing electrical connections to the circuit elements (not shown) and/or one or more lower interconnect layers including trenches and/or contact vias filled with an electrically conductive material such as, for example, copper (not shown).

For providing the substrate 101, known semiconductor manufacturing techniques may be used, which may include front-end-of-line (FEOL) manufacturing processes, middle-of-line (MOL) manufacturing processes and/or back-end-of-line (BEOL) manufacturing processes. In some embodiments, for forming lower interconnect layers including trenches and contact vias filled with an electrically conductive material, techniques as described below may be used.

The semiconductor structure 100 further includes an interlayer dielectric 102. The interlayer dielectric 102 may include silicon dioxide or a low-k dielectric material having a dielectric constant smaller than a dielectric constant of silicon dioxide, for example, a dielectric constant of less than about 3.9 and/or an ultra-low-k dielectric having a dielectric constant of less than about 2.4. Examples of materials that may be used for the interlayer dielectric 102 include fluorine-doped silicon dioxide, carbon-doped silicon dioxide, porous silicon dioxide, porous fluorine-doped silicon dioxide, porous carbon-doped silicon dioxide and/or a polymeric dielectric material, for example, a polyimide, a polynorbornene, a benzocyclobutene, a polytetrafluoroethylene, a hydrogen silsesquioxane and/or a methylsilsesquioxane. Examples of ultra-low-k interlayer dielectrics that may be used for the interlayer dielectric 102 include OMCTS2.7, being a porous SiCOH material that is obtainable by performing a chemical vapor deposition process or plasma-enhanced chemical vapor deposition process wherein OMCTS (octamethylcyclotetrasiloxane) is used as a precursor. The interlayer dielectric 102 may be formed by means of chemical vapor deposition, plasma-enhanced chemical vapor deposition and/or spin coating, depending on the material used.

In the interlayer dielectric 102, a trench 105 may be provided. In the view of FIG. 1, the trench 105 extends substantially perpendicular to the plane of drawing. In addition to the trench 105, other trenches and contact vias may be provided in the interlayer dielectric 102. For forming the trench 105 and/or other trenches and contact vias, known techniques of photolithography and etching may be employed.

In the trench 105, a diffusion barrier 106 may be provided. The diffusion barrier 106 may include a tantalum nitride layer 107 which may be provided directly on the interlayer dielectric 102, a tantalum layer 108 over the tantalum nitride layer 107 and a tantalum layer 109 over the tantalum layer 108. The tantalum layer 109 may include alpha phase tantalum having substantially a bcc crystal structure. In some embodiments, substantially the entire tantalum 109 may be formed of alpha phase tantalum. In other embodiments, the tantalum layer 109 may include grains of alpha phase tantalum, which may be surrounded by tantalum having a crystal structure other than alpha phase tantalum, for example, beta phase tantalum and/or amorphous tantalum.

The tantalum layer 108 may include tantalum having a crystal structure other than alpha phase tantalum, for example, beta phase tantalum having a substantially tetragonal crystal structure and/or amorphous tantalum. In some embodiments, the tantalum layer 108 may include some alpha phase tantalum, for example, in the form of grains of alpha phase tantalum, wherein, however, the proportion of alpha phase tantalum in the tantalum layer 109 may be greater than the proportion of alpha phase tantalum in the tantalum layer 108.

In some embodiments, an interface layer, which may be provided in the form of a portion of the tantalum layer 108 that includes nitrogen in addition to tantalum, may be arranged between the tantalum layers 108, 109.

In addition to the diffusion barrier 106, in the trench 105, an electrically conductive metal 110, which may include copper, may be provided. In some embodiments, the electrically conductive metal 110 may include substantially pure copper. In other embodiments, the electrically conductive metal 110 may include a copper alloy, for example, an alloy of copper and aluminum.

For forming the diffusion barrier 106 and the electrically conductive metal 110, techniques as described below may be used.

The semiconductor structure 100 further includes a cover layer 103. In some embodiments, the cover layer 103 may include silicon nitride, and it may be formed by means of deposition techniques such as chemical vapor deposition and/or plasma-enhanced chemical vapor deposition.

The semiconductor structure 100 may further include an interlayer dielectric 104 that is provided over the cover layer 103, the interlayer dielectric 102 and portions of the trench 105. Materials that may be used for the interlayer dielectric 104 may correspond to the materials that may be used for the interlayer dielectric 102, and corresponding techniques may be employed for the formation thereof. In some embodiments, the interlayer dielectric 104 and the interlayer dielectric 102 may be formed of substantially the same material.

In the interlayer dielectric 104, a contact via 111 and a trench 112 may be provided, which may be formed by means of known techniques of photolithography and etching. The contact via 111 may extend through the interlayer dielectric 104 and the cover layer 103 so that the electrically conductive metal 110 in the trench 105 is exposed at the bottom of the contact via 111. The contact via 111 may have a bottom surface 115 and a sidewall surface 116. Similarly, the trench 112 may have a bottom surface 117 and a sidewall surface 118.

After the formation of the contact via 111 and the trench 112 in the interlayer dielectric 104, a diffusion barrier 415 (see FIGS. 4a to 5) may be formed over the semiconductor structure 100.

The formation of the diffusion barrier 415 may include performing a tantalum nitride deposition process, schematically denoted by arrows 114 in FIG. 1. The tantalum nitride deposition process 114 may deposit a tantalum nitride layer 113 over the semiconductor structure 100, in particular over the bottom surface 115 and the sidewall surface 116 of the contact via 111 as well as over the bottom surface 117 and the sidewall surface 118 of the trench 112. The tantalum nitride layer 113 may contact the interlayer dielectric 104 and the portion of the electrically conductive metal 110 in the trench 105 that is exposed at the bottom surface 115 of the contact via 111. The tantalum nitride deposition process 114 may include a physical vapor deposition process such as, for example, sputtering. Portions of the tantalum nitride layer 113 deposited on substantially horizontal positions of the semiconductor structure 100 outside the contact via 111 and the trench 112 may have a thickness in a range from about 10-50 Å, for example a thickness of about 20 Å.

Figure 2:
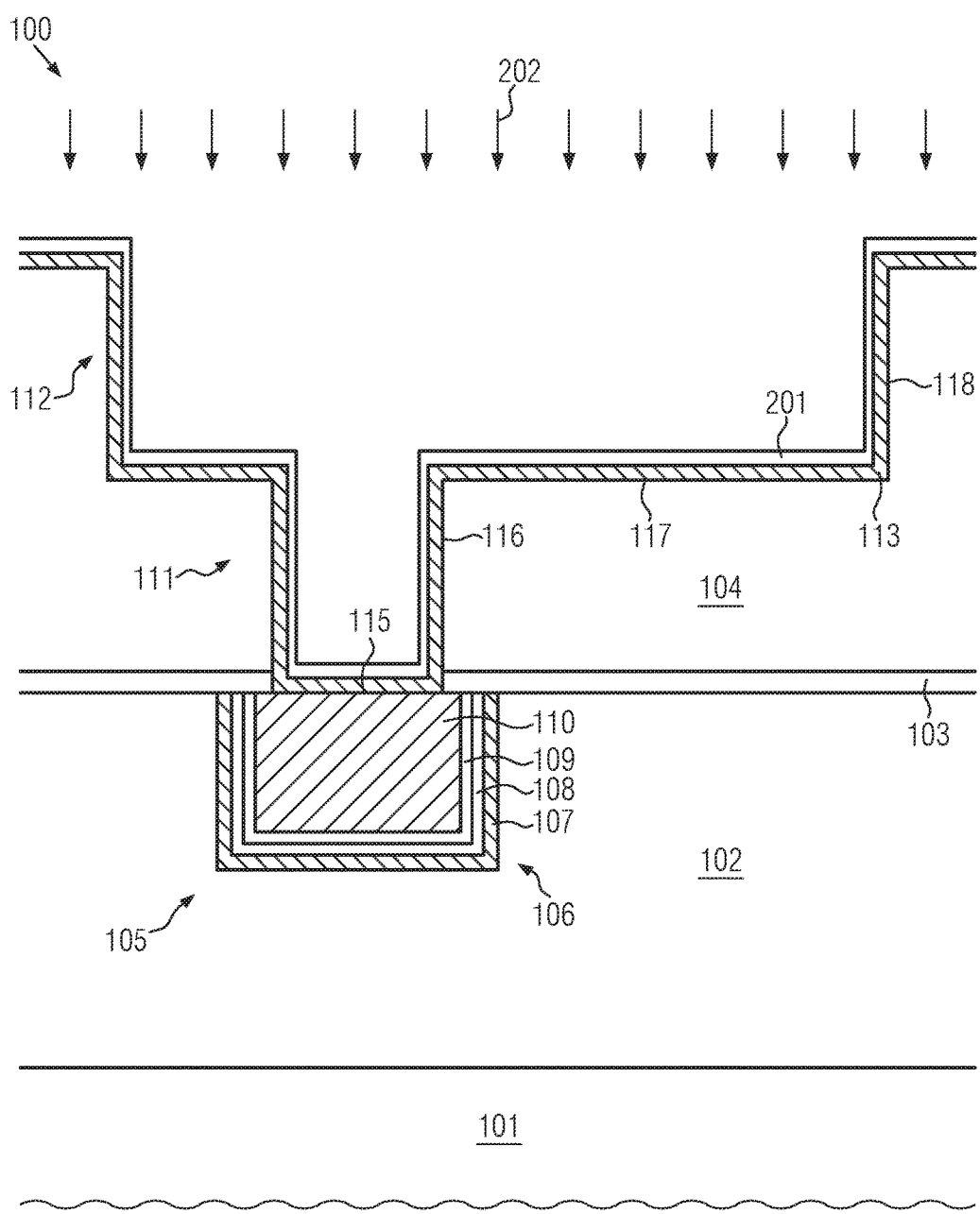

FIG. 2 shows a schematic cross-sectional view of the semiconductor structure 100 in a later stage of the manufacturing process. After the formation of the tantalum nitride layer 113, a tantalum deposition process may be performed, which is denoted by arrows 202 in FIG. 2. The tantalum deposition process 202 may form a tantalum layer 201 over the semiconductor structure 100. The tantalum layer 201 may cover the bottom surface 115 and the sidewall surface 116 of the contact via 111 as well as the bottom surface 117 and the sidewall surface 118 of the trench 112. Additionally, portions of the tantalum layer 201 may be deposited on substantially horizontal portions of the semiconductor structure 100 outside the contact via 111 and the trench 112, for example, on portions of the surface of the interlayer dielectric 104 adjacent the trench 112. Portions of the tantalum layer 201 that are deposited on such horizontal portions of the surface of the semiconductor structure 100 may have a thickness in a range from about 10-110 Å, for example, a thickness of about 20 Å. A thickness of portions of the tantalum layer 201 that are deposited at the bottom surface 115 and the sidewall surface 116 of the contact via 111 and/or the bottom surface 117 and the sidewall surface 118 of the trench 112 may be different, as will be described in more detail below.

The tantalum deposition process 202 may be a physical vapor deposition process such as, for example, sputtering. The physical vapor deposition process may be performed at a relatively high ion flux, a relatively high ion energy and a relatively low temperature. A process pressure of the tantalum deposition process 202 may be in a range from about 0.5-2.0 mTorr. A plasma power may be in a range from about 5-30 kW, and a radio frequency bias power may be in a range from about 200-1000 Watt. The temperature at which the tantalum deposition process 202 is performed may be in a range from about −50° C. to about 50° C.

The tantalum layer 201 may include tantalum having a crystal structure that is different from a crystal structure of alpha phase tantalum. In particular, the tantalum layer 201 may include beta phase tantalum. In some embodiments, the tantalum layer 201 may include a certain amount of alpha phase tantalum, wherein, however, the proportion of alpha phase tantalum in the tantalum layer 201 may be relatively small. For example, the proportion of alpha phase tantalum in the tantalum layer 201 may be less than about 50%. The proportion of alpha phase tantalum in a tantalum layer such as, for example, the tantalum layer 201 may be a ratio between an amount of tantalum in the layer having a crystal structure that substantially corresponds to the crystal structure of alpha phase tantalum to an amount of tantalum in the layer having a crystal structure that is different from the crystal structure of alpha phase tantalum. The crystal structure may be determined by means of techniques of electron beam diffraction and/or X-ray diffraction.

Figure 3A:
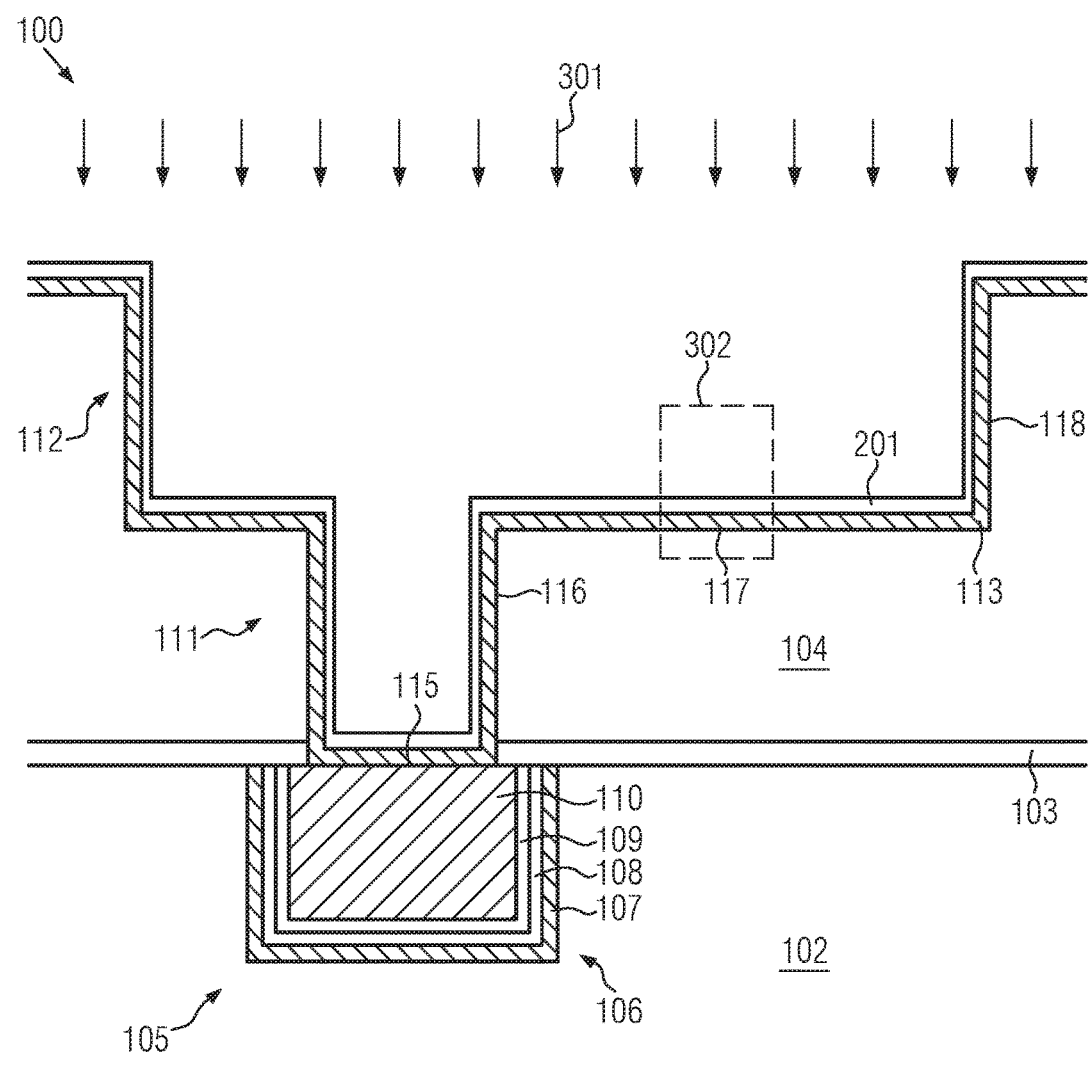

FIG. 3a shows a schematic cross-sectional view of the semiconductor structure 100 in a later stage of the manufacturing process. After the tantalum deposition process 201 wherein the tantalum layer 201 is formed, a treatment of the tantalum layer 201 may be performed that is denoted by arrows 301 in FIG. 3a. The treatment 301 may modify at least a portion of the tantalum layer 201. In some embodiments, the treatment 301 may modify a chemical composition of at least a portion of the tantalum layer 201. In such embodiments, the treatment 301 may introduce a chemical element other than tantalum into at least a portion of the tantalum layer 201. The chemical element other than tantalum may include nitrogen and/or a noble gas such as, for example, argon.

Additionally and/or alternatively, the treatment 301 may modify a crystal structure of at least a portion of the tantalum layer 201. For example, in some embodiments, the treatment 201 may amorphize at least a portion of the tantalum layer 201 so that a long range crystalline order of the tantalum atoms is lost at least in a portion of the tantalum layer 201.

Figure 3B:
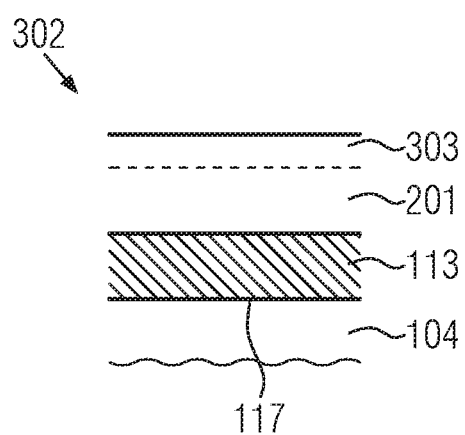

FIG. 3b shows an enlarged view of a part 302 of the semiconductor structure 100 that includes a portion of the bottom surface 117 of the trench 112. FIG. 3b shows portions of the tantalum nitride layer 113 and the tantalum layer 201 as obtained at the bottom of the trench 112 after the treatment 301. Reference numeral 303 denotes a portion of the tantalum layer 201 at a surface of the tantalum layer 201 that is opposite to an interface between the tantalum layer 201 and the tantalum nitride layer 113 that is modified by the treatment 301. The portion 303 may provide an interface layer between the tantalum layer 201 and another tantalum layer 401 deposited thereon in later stages of the manufacturing process (see FIGS. 4a, 4b and 4c).

The present disclosure is not limited to embodiments wherein only a portion of the tantalum layer 201 at the surface of the tantalum layer 201 is modified by the treatment 301. In other embodiments, a chemical composition and/or crystalline structure of substantially the entire tantalum layer 201 may be modified by the treatment 301.

In some embodiments, the treatment 301 may include exposing the tantalum layer 201 to a plasma. The plasma may be an inductively-coupled plasma that may be obtained by applying a radio frequency magnetic field to a gas such that the gas is ionized. Techniques for creating an inductively-coupled plasma are known. In some embodiments, the treatment 301 wherein the tantalum layer 201 is exposed to an inductively-coupled plasma may be performed in situ. In such embodiments, the tantalum deposition process 201, the treatment 301, as well as another tantalum deposition process 402 that will be described below with reference to FIGS. 4a-4c, may be performed in a same processing chamber of a semiconductor processing tool. The present disclosure, however, is not limited to such embodiments. In other embodiments, the treatment 301 may be performed in another processing chamber and/or another semiconductor processing tool.

In some embodiments, in the treatment 301, the tantalum layer 201 may be exposed to a nitrogen plasma that may be obtained by ionizing nitrogen ($N_2$), for example, by means of an inductively coupled plasma source. In some embodiments, the semiconductor 100 having the tantalum layer 201 at a surface thereof may be exposed to an inductively-coupled nitrogen plasma at an inductively coupled plasma (ICP) power in a range from about 500-2000 W, in particular, in a range from about 800-1700 W, for example an ICP power of about 1000 W or about 1500 W for typical 200 mm or 300 mm wafer sizes for a time in a range from about 2-60 seconds, for example, for a time of about 5 seconds or about 30 seconds. The process pressure may be in a range from about 4-12 mTorr, and the temperature may be in a range from about −50° C. to about 50° C.

The present disclosure is not limited to embodiments wherein the semiconductor structure 100 is exposed to a nitrogen plasma in the treatment 301. In other embodiments, a plasma having a different chemical composition may be used. In some embodiments, the treatment 301 may include exposing the semiconductor structure 100 having the tantalum layer 201 thereon to a plasma including a chemical compound that includes nitrogen, for example, to a plasma including ammonia ($NH_3$). In some embodiments, the semiconductor structure 100 may be exposed to an ammonia plasma at an ICP power in a range from about 800-1700 W, for example, an ICP power of about 1250 W for typical 200 mm or 300 mm wafers. A duration of the exposure of the semiconductor structure 100 to the ammonia plasma may be in a range from about 10-30 seconds, for example, for about 20 seconds.

In other embodiments, the semiconductor structure 100 may be exposed to an inductively-coupled argon (Ar) plasma that may be obtained by applying a radio frequency magnetic field to a gas including substantially pure argon. In further embodiments, a nitrogen argon plasma that may be obtained by applying a radio frequency magnetic field to a gas including a mixture of argon and nitrogen may be used. In embodiments wherein an argon plasma or an argon nitrogen plasma is used, parameters of the treatment 301, such as a plasma power and/or a time of the treatment, may correspond to the above-described parameters that are used in embodiments wherein the treatment 301 includes exposing the semiconductor structure 100 to an inductively-coupled nitrogen plasma. For example, the semiconductor structure 100 having the tantalum layer 201 formed thereon may be exposed to an inductively-coupled argon plasma or an inductively-coupled argon nitrogen plasma at a plasma power of about 1000 W for a time of about 5 seconds.

The present disclosure is not limited to embodiments wherein the treatment 301 includes exposing the semiconductor structure 100 having the tantalum layer 201 formed thereon to a plasma. In other embodiments, the treatment 301 may include exposing the semiconductor structure 100 to a flow of a substantially non-ionized gas including nitrogen. In some of these embodiments, the semiconductor structure 100 may be exposed to a flow of substantially pure nitrogen ($N_2$) gas for a time in a range from about 15-90 seconds, for example, for a time of about 30 seconds or a time of about 60 seconds, wherein the gas flow may be in a range from about 5-100 sccm, and the temperature may be in a range from about 0-40° C., for example, about room temperature. In some embodiments, the treatment 301 may include a thermal processing in addition to exposing the semiconductor structure 100 having the tantalum layer 201 formed thereon to a nitrogen gas flow. For example, the semiconductor structure 100 may be heated to a temperature in a range from about 20-50° C. for a time in a range from about 5-90 seconds, for example, for a time of about 60 seconds. Thereafter, the semiconductor structure 100 may be exposed to a nitrogen flow as described above for about 60 seconds.

Figure 4A:
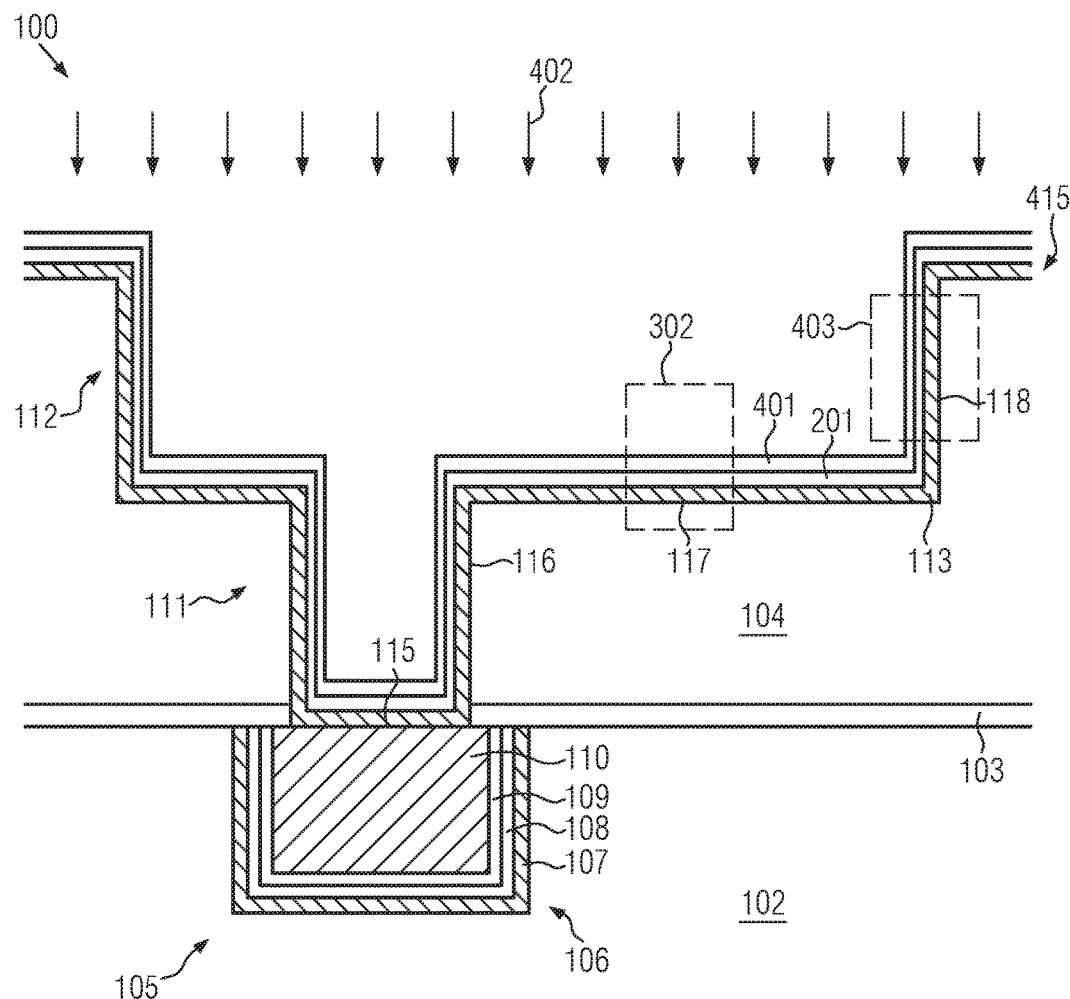

FIG. 4a shows a schematic cross-sectional view of the semiconductor structure 100 in later stage of the manufacturing process. After the treatment 301 of the tantalum layer 201, a tantalum deposition process may be performed that is denoted by reference numeral 402 in FIG. 4a. Similar to the tantalum deposition process 202 described above with reference to FIG. 2 that is used for forming the tantalum layer 201 on the tantalum nitride layer 117, the tantalum deposition process 402 may be a physical vapor deposition process, for example, a sputtering process. Parameters of the tantalum deposition process 402, such as ion flux, ion energy and temperature, may substantially correspond to parameters of the tantalum deposition process 202 described above.

The tantalum deposition process 402 may form a tantalum layer 401 over the tantalum layer 201, wherein the tantalum layer 401 may be deposited on, in particular directly on, the modified portion 303 of the tantalum layer 201.

In some embodiments, the tantalum deposition process 402 may be adapted such that a thickness of the tantalum layer 401, in particular a thickness of portions of the tantalum layer 401 that are deposited on substantially horizontal portions of the surface of the semiconductor structure 100 outside the contact via 111 and the trench 112, is approximately equal to a thickness of the tantalum layer 201, in particular a thickness of portions of the tantalum layer 201 that are deposited on substantially horizontal portions of the surface of the semiconductor structure 100 outside the contact via 111 and the trench 112. In other embodiments, the thicknesses of the tantalum layers 401, 201 may be different. For example, the thickness of the tantalum layer 401 may be greater than the thickness of the tantalum layer 201. In some embodiments, the thickness of the tantalum layer 401 may be about twice the thickness of the tantalum layer 201.

Figure 4B:
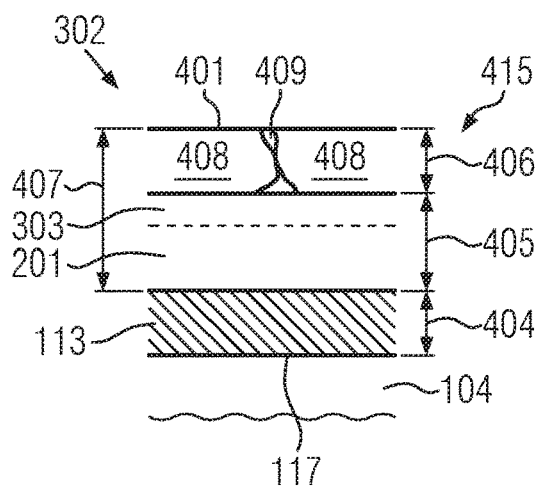

FIG. 4b shows an enlarged view of the part 302 of the semiconductor structure 100 described above with reference to FIGS. 3a and 3b. In addition to portions of the tantalum nitride layer 113 and the tantalum layer 201 at the bottom surface 117 of the trench 112, FIG. 4b schematically illustrates a portion of the tantalum layer 401 at the bottom of the trench 112.

Figure 4C:
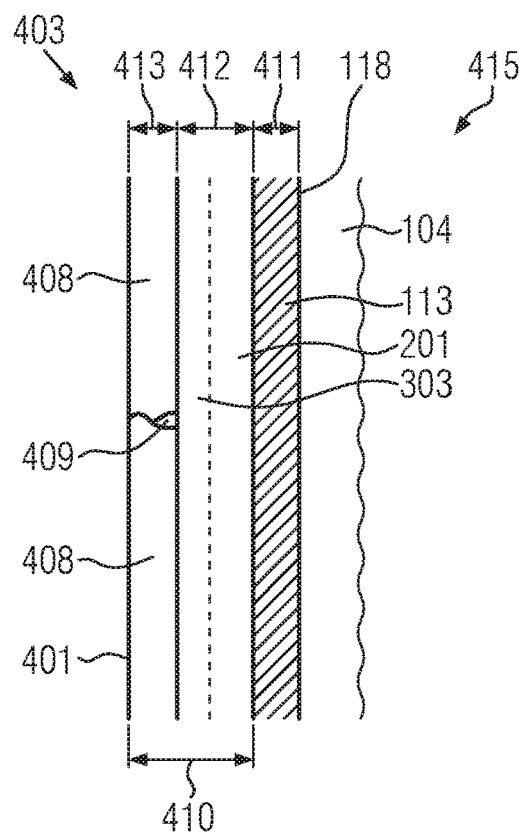

FIG. 4c shows an enlarged view of a part 403 of the semiconductor structure 100 at the sidewall surface 118 of the trench 112. FIG. 4c schematically illustrates portions of the tantalum nitride layer 113 and the tantalum layers 201, 401 at the sidewall surface 118 of the trench 112.

The presence of the modified portion 303 of the tantalum layer 201 may have an influence on the crystalline structure of the tantalum layer 401 that is deposited thereon by the tantalum deposition process 402. The modification of the portion 303 of the tantalum layer 201 may induce a formation of the alpha phase of tantalum in at least a portion of the tantalum layer 401, so that a proportion of alpha phase tantalum in the tantalum layer 401 is greater than the proportion of alpha phase tantalum in the tantalum layer 201. In FIGS. 4b and 4c, reference numeral 408 schematically denotes portions of the tantalum layer 401 having a crystal structure that substantially corresponds to the crystal structure of alpha phase tantalum. In some embodiments, the tantalum layer 401 may additionally include portions 409 that include tantalum having a different crystal structure than the crystal structure of alpha phase tantalum, for example, a crystal structure that substantially corresponds to the crystal structure of beta phase tantalum and/or an amorphous structure.

While, in some embodiments, substantially the entire tantalum layer 401 may have a crystal structure that substantially corresponds to the crystal structure of alpha phase tantalum, in other embodiments, the tantalum layer 401 may include grains of alpha phase tantalum that are embedded in a matrix of tantalum having another crystal structure, for example, beta phase tantalum and/or amorphous tantalum.

The greater proportion of alpha phase tantalum in the tantalum layer 401 as compared to the tantalum layer 201 may reduce the resistivity of the combination of the tantalum layers 201, 401.

TABLE 1

| Wafer | Layer 1 | Interrupt Setup | Layer 2 | Rs Mean [Ohm/sq]2 | Rs WiWNU [%] | Rho [μOhmcm] |
|---|---|---|---|---|---|---|
| 1 | 100 Å PVD Ta | 30 s Ar Flow | 100 Å PVD Ta | 89 | 3% | 184 |
| 2 | 100 Å PVD Ta | 30 s N2 Flow | 100 Å PVD Ta | 63 | 8% | 131 |
| 3 | 100 Å PVD Ta | 30 s Ar Plasma | 100 Å PVD Ta | 78 | 2% | 179 |
| 4 | 100 Å PVD Ta | 30 s N2 Plasma | 100 Å PVD Ta | 45 | 8% | 97 |
| 5 | 100 Å PVD Ta | 60 s Degas + 60 s N2 Flow | 100 Å PVD Ta | 77 | 9% | 171 |

Table 1 illustrates experiments that have been performed by the inventors. In each of the experiments, a first tantalum layer (denoted as "Layer 1" in the Table) and a second tantalum layer (denoted as "Layer 2") were deposited by means of physical vapor deposition over a wafer having a silicon dioxide layer formed thereon. Both tantalum layers had a thickness of about 100 Å. Between the deposition of Layer 1 and the deposition of Layer 2, the tantalum deposition process was interrupted. Wafer 1 was exposed to a flow of substantially non-ionized argon gas for 30 seconds during the interruption. Wafer 2 was exposed to a flow of substantially non-ionized nitrogen gas for 30 seconds, Wafer 3 was exposed to an argon plasma for 30 seconds and Wafer 4 was exposed to a nitrogen plasma for 30 seconds. For Wafer 5, a thermal treatment of the wafer was performed in a degas apparatus for 30 seconds. Thereafter, Wafer 5 was exposed to a flow of substantially non-ionized nitrogen gas for 60 seconds.

Table 1 additionally shows results of measurements of a mean sheet resistance Rs Mean of the combination of Layer 1 and Layer 2, a within-wafer non-uniformity of the sheet resistance Rs WiWNU, and a resistivity Rho of the combination of Layer 1 and Layer 2. As can be seen from Table 1, for each of Wafers 2, 3, 4 and 5, a smaller sheet resistance and a smaller resistivity was obtained than for Wafer 1, which indicates that performing a treatment of tantalum Layer 1 by means of a nitrogen flow, an argon plasma, a nitrogen plasma and/or a combination of a thermal treatment and a nitrogen flow can induce the formation of alpha phase tantalum which has a smaller resistivity than beta phase tantalum. The smallest sheet resistance and the smallest resistivity were obtained for a treatment of tantalum Layer 1 by a nitrogen plasma, which indicates that treating a tantalum layer by a nitrogen plasma can be advantageous for obtaining a relatively high proportion of alpha phase tantalum in another tantalum layer deposited thereon.

Measurements of a chemical composition in the vicinity of the surface of Wafers 1 to 5 by means of Auger (AES) depth profiling have shown that nitrogen was incorporated into the tantalum Layer 1 at the surface of wafer 4, wherein a maximum of the atomic concentration of nitrogen of 32.1 at % was obtained, which indicates that a chemical composition of a portion of tantalum Layer 1 at the surface thereof was modified by an incorporation of nitrogen during the interrupt wherein the nitrogen plasma treatment was performed. For the other wafers, substantially no change of the chemical composition by the treatment of tantalum Layer 1 was detected, which may indicate that the formation of alpha phase tantalum in Layer 2 causing the reduction of the sheet resistance and the resistivity was obtained due to a modification of the crystal structure of the tantalum Layer 1.

Further experiments performed by the inventors have confirmed that a crystal structure corresponding to the crystal structure of alpha phase tantalum is present in portions of Layer 2 when the wafer is exposed to a flow of substantially non-ionized nitrogen or to a nitrogen plasma during the interrupt between the formation of the two tantalum layers. In the case of a flow of substantially non-ionized nitrogen, some grains of alpha phase tantalum were obtained, whereas, in the case of a treatment by means of an inductively-coupled nitrogen plasma, a two-layer stack having an upper layer consisting substantially of alpha phase tantalum could be obtained. For the lower layer of tantalum that was deposited before the interrupt wherein the treatment was performed, a crystal structure substantially corresponding to the crystal structure of beta phase tantalum was obtained.

The tantalum nitride layer 113, the tantalum layer 201 and the tantalum layer 401 form a diffusion barrier 415 that covers, in particular, the bottom surface 115 and the sidewall surface 116 of the contact via 111 as well as the bottom surface 117 and the sidewall surface 118 of the trench 112. By providing a substantial proportion of alpha phase tantalum in the tantalum layer 401, as described above, a resistivity and/or a sheet resistance of the diffusion barrier layer 415 can be reduced compared to diffusion barrier layers wherein no treatment 301 is performed between the deposition of the tantalum layer 201 and the tantalum layer 401.

Additionally, performing the treatment 301 of the tantalum layer 201 may improve a step coverage of the diffusion barrier layer 415 and/or a step coverage of the tantalum part of the diffusion barrier layer 415 that is provided by the tantalum layers 201, 401.

In FIG. 4b, reference numerals 404, 405, 406 denote thicknesses of the tantalum nitride layer 113, the tantalum layer 201 and the tantalum layer 401, respectively, at the bottom surface 117 of the trench 112. Reference numeral 407 denotes a total thickness of the tantalum part of the diffusion barrier layer 415 that is provided by the tantalum layers 201, 401 and substantially corresponds to a sum of the thicknesses 405, 406.

In FIG. 4c, the thicknesses of the portions of the diffusion barrier layer 415 at the sidewall surface 118 of the trench 112 are denoted by reference numerals 411 (thickness of the tantalum nitride layer 113), 412 (thickness of the tantalum layer 201), 413 (thickness of the tantalum layer 401) and 410 (total thickness of the tantalum layers 201, 401).

Generally, each of the layers 113, 201, 401 may be thicker at the bottom surface 117 of the trench 112 than at the sidewall surface 118 of the trench 112 so that the thickness 411 may be smaller than the thickness 404, the thickness 412 may be smaller than the thickness 405, the thickness 413 may be smaller than the thickness 406 and the thickness 410 may be smaller than the thickness 407. For each of the layers 113, 201, 401, and the combination of the layers 201, 401, a ratio between a thickness of the respective layer or combination of layers at the bottom surface 117 of the trench 112 and the thickness of the respective layer or combination of layers at the sidewall surface 118 of the trench 112 defines a bottom and sidewall step coverage of the respective layer or combination of layers.

Experiments performed by the inventors wherein the thicknesses 404, 411 of the tantalum nitride layer 111 and the combined thicknesses 407, 410 of the tantalum layers 201, 401 were measured using techniques of electron microscopy have shown that performing a treatment of the tantalum layer 201 wherein the tantalum layer 201 is exposed to an inductive coupled nitrogen plasma before the deposition of the tantalum layer 401 can increase the bottom and sidewall step coverage of the combination of the tantalum layers 201, 401 by a factor of up to 1.7, which may help to improve the diffusion barrier properties of the diffusion barrier 415.

Figure 5:
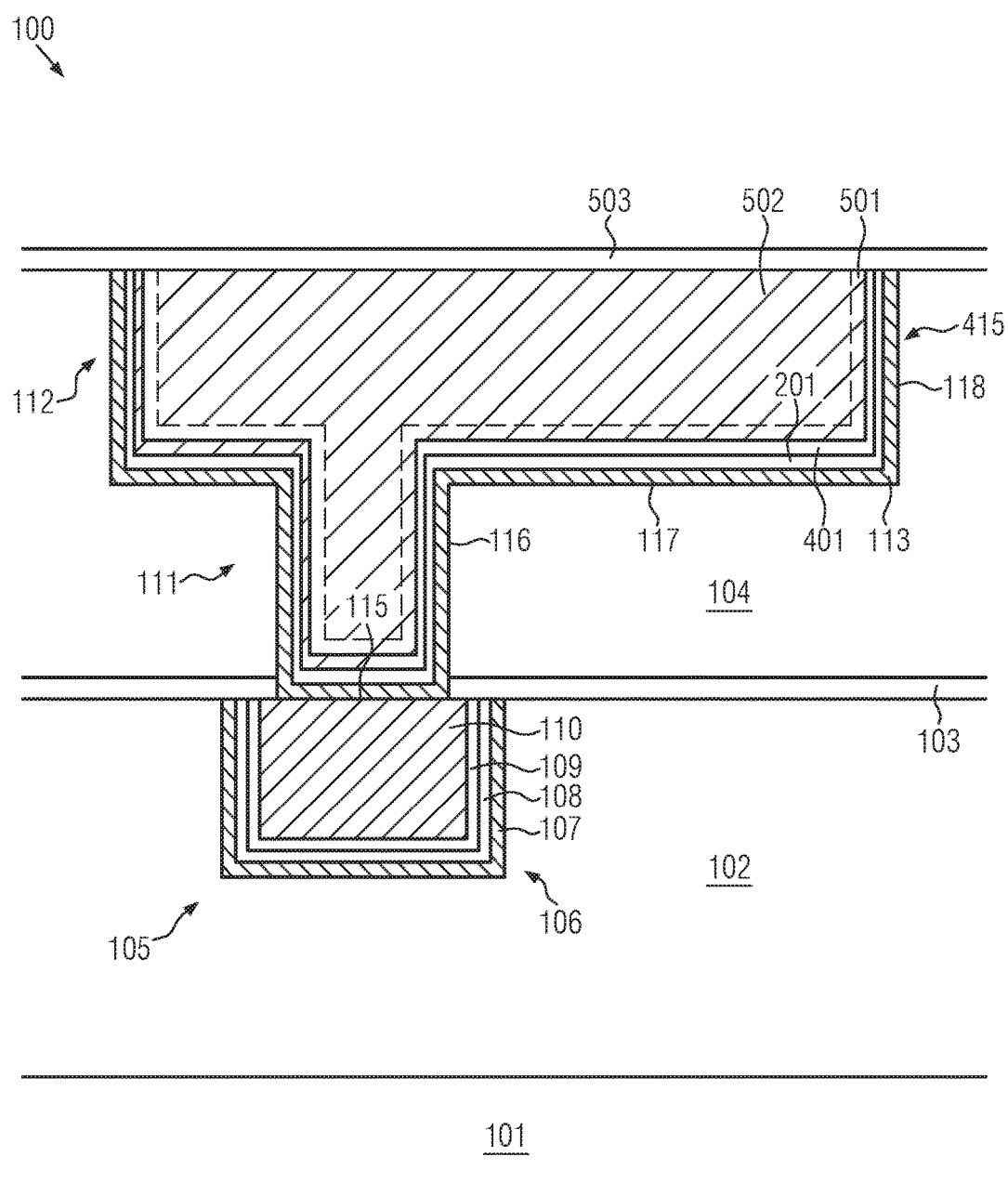

FIG. 5 shows a schematic cross-sectional view of the semiconductor structure 100 in a later stage of the manufacturing process. After the formation of the diffusion barrier 415 described above with reference to FIGS. 4a-4c, a seed layer 501 may be deposited over the semiconductor structure 100, for example, by means of chemical vapor deposition, plasma-enhanced chemical vapor deposition, physical vapor deposition and/or electroless plating. A thickness of the seed layer 501 may be in a range from about 125-500 Å.

Thereafter, the contact via 111 and the trench 112 may be filled with an electrically conductive metal 502 including copper, for example, substantially pure copper and/or an alloy of copper and aluminum. This may be done by means of techniques of electroplating. Thereafter, a chemical mechanical polishing process may be performed for removing portions of the diffusion barrier 415, the seed layer 501 and/or the electrically conductive metal 502 outside the contact via 111 and the trench 112. Thus, an electrically conductive metal line may be provided in the trench 112, and a connection to the electrically conductive metal 110 in the trench 105 may be provided by means of the contact via 111. Thereafter, a cover layer 503 may be deposited over the semiconductor structure 100. Features of the cover layer 503 may correspond to those of the cover layer 103, and corresponding methods may be used for the formation thereof.

Experiments performed by the inventors have shown that the diffusion barrier 415 described above can reduce via and line resistances, in particular in embodiments wherein the treatment of the tantalum layer 201 includes an application of an inductively coupled nitrogen plasma.

In some embodiments, in addition to the acts described above, an etch back process, for example a plasma etch back process, may be performed for reducing a thickness of portions of the diffusion barrier layer 415 at the bottom surfaces 115, 117 of the contact via 111 and the trench 112. In some embodiments, the plasma etch back process may be performed after the treatment 301 of the tantalum layer 201 and before the tantalum deposition process 402 that is performed for forming the tantalum layer 401. Alternatively, the plasma etch back process may be performed after the tantalum deposition process 202 that is used for forming the tantalum layer 201 and before the treatment 301 of the tantalum layer 201.

In embodiments wherein a plasma etch back process is performed, a slightly greater thickness of the tantalum layer 401 may be provided than in embodiments wherein no plasma etch back process is performed. For example, a thickness of portions of the tantalum layer 401 over substantially horizontal portions of the semiconductor structure 100 outside the contact via 111 and the trench 112 may be about 40 Å. Performing the plasma etch back process before the formation of the tantalum layer 401 which obtains a relatively high proportion of alpha phase tantalum having a relatively low resistivity may help to reduce the amount of tantalum from the tantalum layer 201 in the diffusion barrier 415 that has a crystal structure different from that of alpha phase tantalum. Thus, the electrical resistance of electrically conductive lines and electrical connections provided by trenches and contact vias wherein the diffusion barrier layer 415 is provided may be further reduced.

Further features of the plasma etch back process may correspond to those of known plasma etch back processes that are used in the formation of diffusion barrier layers including tantalum.

The present disclosure is not limited to embodiments wherein the tantalum nitride layer 113 is formed below the tantalum layers 201, 401. In some embodiments, the tantalum nitride layer 113 may be omitted, and the tantalum layer 201 may be deposited directly on the interlayer dielectric 104.

In the following, further embodiments will be described with reference to FIGS. 6 and 7. For convenience, in FIGS. 1-5, on the one hand, and in FIGS. 6-7, on the other hand, like reference numerals have been used to denote like components. Unless explicitly indicated otherwise, components denoted by like reference numerals may have corresponding features, and corresponding methods may be used for the formation thereof.

Figure 6:
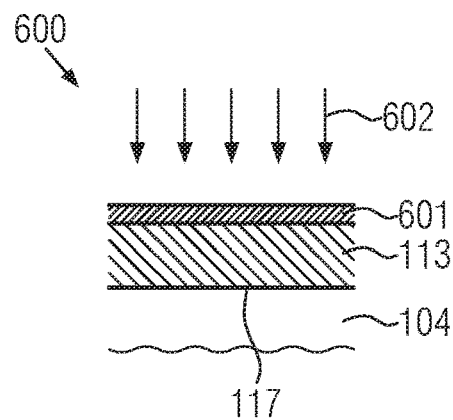
FIGS. 6 and 7 show schematic cross-sectional views of a portion of a semiconductor structure in stages of a method according to an embodiment.

FIG. 6 shows a schematic cross-sectional view of a part of a semiconductor structure 600 at a bottom surface 117 of a trench in an interlayer dielectric 104, similar to the part 302 shown in FIGS. 3a, 3b, 4a and 4b. In addition to the bottom surface 117, the trench may have a sidewall surface similar to the sidewall surface 118 described above. Additionally, the semiconductor structure 600 may include one or more contact vias similar to the contact via 111 shown in FIGS. 1-5 and one or more trenches and/or contact vias in lower interconnect levels similar to the trench 105 shown in FIGS. 1-5.

Similar to the methods described above with reference to FIGS. 1-5, a tantalum nitride layer 113 may be formed. This may be done by means of a physical vapor deposition process for the deposition of tantalum nitride similar to the tantalum nitride deposition process 114 described above with reference to FIG. 1, for example a sputter process. A thickness of portions of the tantalum nitride layer 113 that are deposited on substantially horizontal portions of the surface of the semiconductor structure 600 may be in a range from about 10-50 Å, for example, about 20 Å and/or about 40 Å.

Thereafter, another tantalum nitride deposition process may be performed, which is schematically denoted by arrows 602 in FIG. 6. The tantalum nitride deposition process 602 may be an atomic layer deposition process adapted for the formation of tantalum nitride, and it may form a tantalum nitride layer 601 over the tantalum nitride layer 113. In some embodiments, the tantalum nitride deposition process 602 may include a thermal atomic layer deposition process, which may be performed at a temperature in a range from about 200-300° C.

In the atomic layer deposition process, a number of atomic layer deposition cycles may be performed wherein two precursors are alternately supplied to the semiconductor structure 600. One of the precursors includes tantalum and the other precursor includes nitrogen. Each atomic layer deposition cycle includes a first phase wherein the first precursor is supplied and a second phase wherein the second precursor is supplied. During the supply of the first precursor, the first precursor may be adsorbed to the surface of the semiconductor structure 600. Thereafter, the supply of the first precursor may be stopped, and the second precursor may be supplied. The second precursor may react chemically with the first precursor adsorbed at the surface of the semiconductor structure 600, wherein tantalum nitride is formed. Since the amount of tantalum nitride that is formed in each atomic layer deposition cycle is limited by the amount of the first precursor that is supplied to the surface of the semiconductor structure, atomic layer deposition may allow the formation of highly conformal tantalum nitride layers having a well-defined thickness.

Examples of precursors including nitrogen that may be used for the atomic layer deposition of tantalum nitride include ammonia ($NH_3$) and hydrazine ($N_2H_4$). Examples of precursors including tantalum include:
(tert-butylamido)tris-(dimethylamido)tantalum (TBTPET),
pentakis(dimethylamino)tantalum(V)(PDMAT),
t-amylimidotris(dimethylamido)tantalum(V)(TAIMATA)
  tert-butyliminotris(ethylmethyl-amino)tantalum (TBTEMT) and
TertiaryButylimido,Tris(DiEthylamino)Tantalum (TBT-DET).

The tantalum nitride layer 601 may have a thickness in a range from about 2-20 Å, for example, a thickness of about 5 Å. The tantalum nitride layer 601 need not be a contiguous layer, as schematically illustrated in FIG. 6. In some embodiments, the tantalum nitride layer 601 may be provided in the form of islands of tantalum nitride formed by atomic layer deposition that are provided on the surface of the tantalum nitride layer 113.

Techniques for forming a tantalum nitride layer by means of atomic layer deposition as described above may provide a nitrogen content of the tantalum nitride layer 601 that is greater than a nitrogen content of the tantalum nitride layer 113, as will be explained in more detail below.

The present disclosure is not limited to embodiments wherein a thermal atomic layer deposition process is performed, as described above. In other embodiments, a plasma-enhanced atomic layer deposition process adapted to provide a relatively high nitrogen content of the tantalum nitride layer 601 may be performed.

Figure 7:
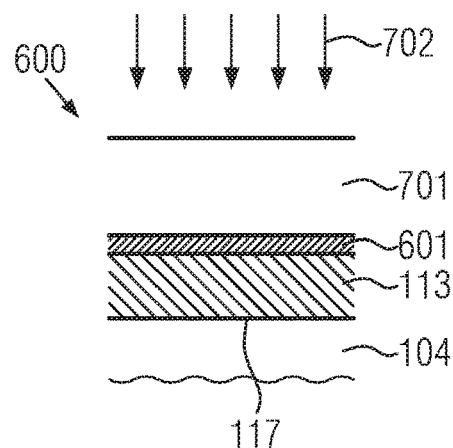

FIG. 7 shows a schematic cross-sectional view of the part of the semiconductor structure 600 in a later stage of the manufacturing process. After the tantalum nitride deposition process 602, a tantalum deposition process that is schematically denoted by arrows 702 in FIG. 7 may be performed. The tantalum deposition process 702 may form a tantalum layer 701 on the tantalum nitride layer 601 over the tantalum nitride layer 113. The tantalum deposition process 702 may include a physical vapor deposition process similar to the tantalum deposition processes 202, 402 described above with reference to FIGS. 2 and 4a-4c. Portions of the tantalum layer 701 over substantially horizontal portions of the surface of the semiconductor structure may have a thickness in a range from about 20-100 Å, for example, a thickness of about 50 Å or about 80 Å.

The presence of the tantalum nitride layer 601 that was formed by the atomic layer deposition process 602 may induce a formation of tantalum having a crystal structure substantially corresponding to the alpha phase of tantalum in the tantalum layer 701. In some embodiments, the tantalum layer 701 may be substantially completely formed of alpha phase tantalum. In other embodiments, the tantalum layer 701 may include grains of alpha phase tantalum that are embedded in a matrix of tantalum having a crystal structure that is different from the crystal structure of alpha phase tantalum, for example, beta phase tantalum and/or amorphous tantalum.

Moreover, the atomic layer deposition process may improve a trench bottom and sidewall step coverage of the diffusion barrier provided by the layers 113, 601, 701 compared to techniques of forming a diffusion barrier wherein no atomic layer deposition process is performed.

The present disclosure is not limited to embodiments wherein the tantalum nitride layer 113 is formed by means of a tantalum deposition process other than an atomic layer deposition process such as, for example, a physical vapor deposition process. In other embodiments, the tantalum nitride layer 113 may be omitted, and a greater thickness of the tantalum nitride layer 601 formed by the atomic layer deposition process 602 may be provided. In some of these embodiments, a plurality of atomic layer deposition processes, for example, four atomic layer deposition processes, may be subsequently performed for forming sublayers of the tantalum nitride layer 601.

TABLE 2

| Wafer | Layer 1 | Layer 2 | Layer 3 | Rs Mean [Ohm/sq]2 | Rs WiWNU [%] | Max N2 [at. %] |
|---|---|---|---|---|---|---|
| 6 | 40 A PVD TaN | 80 A PVD Ta | | 120 | 4% | 24.8 |
| 7 | 4 × 10 A ALD TaN thermal | 80 A PVD Ta | | 80 | 5% | 39.2 |
| 8 | 4 × (10 A ALD TaN thermal + 20 s H2 Plasma Treatment) | 80 A PVD Ta | | 82 | 8% | 36.9 |
| 9 | 40 A PVDTaN | 5 A ALD TaN thermal | 80 A PVD Ta | 76 | 5% | 27.4 |
| 10 | 4 × (10 A ALD TaN thermal + 20 s NH3 Plasma Treatment 600 W) | 80 A PVD Ta | | 77 | 7% | 44.3 |

Table 2 shows results of experiments performed by the inventors. In these experiments, layer stacks including one or two layers of tantalum nitride and one layer of tantalum were deposited on wafers having a layer of silicon dioxide formed thereon. On wafer 6, a layer of tantalum was deposited by means of physical vapor deposition on a tantalum nitride layer formed by means of physical vapor deposition. In this example, wherein no atomic layer deposition of tantalum nitride was performed, a relatively high mean sheet resistance $R_s$ of about 120Ω/□ was obtained. Auger (AES) depth profiling has yielded a maximum atomic concentration of nitrogen of 24.8%.

On wafer 7, a layer of tantalum nitride was deposited by means of a thermal atomic layer deposition process, wherein four depositions of a tantalum nitride layer having a thickness of 10 Å were performed to obtain a tantalum nitride layer having a total thickness of 40 Å. Thus, the layer thicknesses correspond to those used at wafer 6. A sheet resistance of 80Ω/□ was obtained, which is lower than the sheet resistance obtained for wafer 6. Moreover, the maximum atomic concentration of nitrogen obtained in AES depth profiling measurements was 39.2%, which is higher than the maximum nitrogen concentration obtained for wafer 6. On wafers 8 and 10, an atomic layer deposition process for the formation of a tantalum nitride layer and a physical vapor deposition for the formation of a tantalum layer were performed, similar to wafer 7, wherein, however, a plasma treatment was additionally performed. On wafer 8, a hydrogen plasma treatment was performed for 20 seconds, and an ammonia plasma treatment was performed for wafer 10. As can be seen by comparison of the sheet resistances measured for wafers 7, 8 and 10, the ammonia plasma treatment, which increases the nitrogen content of the tantalum nitride layer, reduces the sheet resistance of the layer stack, and the hydrogen plasma treatment which reduces the nitrogen content, increases the sheet resistance. Accordingly, the presence of a relatively high amount of nitrogen in the tantalum nitride layer formed by means of atomic layer deposition can reduce the sheet resistance.

For wafer 9, a relatively thick tantalum nitride layer was deposited by means of physical vapor deposition. Then, a relatively thin tantalum nitride layer having a thickness of 5 Å was deposited thereon by means of a thermal atomic layer deposition process, and a tantalum layer was deposited thereon by means of a physical vapor deposition process. A greater nitrogen content than for wafer 6 and a small sheet resistance of the layer stack were obtained.

The experimental results shown in Table 2 illustrate that a relatively high content of nitrogen in the tantalum nitride layer on which the tantalum layer is formed can reduce the sheet resistance. The reduction of the sheet resistance may be obtained when only a thin tantalum nitride layer having a thickness of 5 Å is deposited by means of atomic layer deposition. Such layers typically are formed not as a closed layer but in the form of islands. Therefore, without wishing to be bound to a particular theory, it is concluded that the reduction of the sheet resistance is caused by a formation of alpha phase tantalum in the deposition of the tantalum layer by means of physical vapor deposition, which may be induced by the presence of a relatively high amount of nitrogen.

Figure 8:
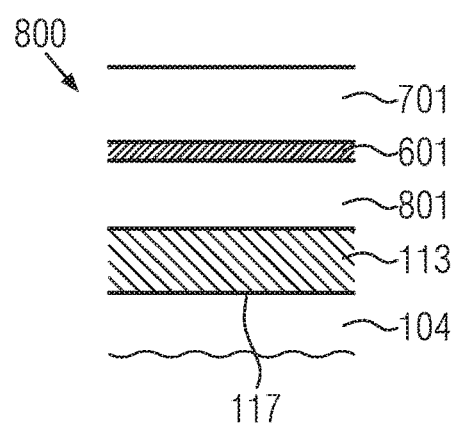
FIG. 8 shows a schematic cross-sectional view of a semiconductor structure at a stage of a method according to an embodiment.

FIG. 8 shows a schematic cross-sectional view of a part of a semiconductor structure 800 according to an embodiment. The part 800 may be provided at a bottom of a trench, similar to the part 302 of the semiconductor structure 100 illustrated in FIGS. 3a, 3b, 4a and 4b. For convenience, in FIGS. 1-7, on the one hand, and in FIG. 8, on the other hand, like reference numerals have been used to denote like components. Unless explicitly indicated otherwise, components denoted by like reference numerals may have corresponding features, and corresponding methods may be used for the formation thereof.

The semiconductor structure 800 includes a tantalum nitride layer 113 that is formed on an interlayer dielectric 104. On the tantalum nitride layer 113, a tantalum layer 801, a tantalum nitride layer 601 and a tantalum layer 701 are provided, wherein the tantalum nitride layer 601 is arranged between the tantalum layers 801, 701 so that the tantalum nitride layer 601 forms an interface layer between the tantalum layers 801, 701.

Techniques for the formation of the layers 113, 801, 601, 701 may correspond to those described above for the formation of the semiconductor structure 600 illustrated in FIGS. 6 and 7, wherein an additional physical vapor deposition process for the deposition of tantalum is performed after the formation of the tantalum nitride layer 113 by means of a physical vapor deposition process and before the formation of the tantalum nitride layer 601 by means of an atomic layer deposition process.

In some embodiments, portions of the tantalum nitride layer 113, the tantalum layer 801, the tantalum nitride layer 601 and the tantalum layer 701 over substantially horizontal portions of the semiconductor structure may have thicknesses of about 20 Å, about 25 Å, about 5 Å and about 25 Å, respectively.

After the processes described above with reference to FIGS. 6, 7 and 8, similar to the embodiments described above with reference to FIGS. 1-5, a seed layer may be deposited over the semiconductor structure 600, 800, and trenches and contact vias of the semiconductor structure may be filled with an electrically conductive material, such as copper and/or a copper alloy.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method, comprising:
  forming a diffusion barrier over a semiconductor structure, the formation of said diffusion barrier comprising:
    performing a first tantalum deposition process, said first tantalum deposition process forming a first tantalum layer over said semiconductor structure, said first tantalum layer having a first proportion of alpha tantalum;
    performing a treatment to modify said first tantalum layer, wherein said treatment amorphizes at least a portion of said first tantalum layer; and
    after said treatment of said first tantalum layer, performing a second tantalum deposition process, said second tantalum deposition process forming a second tantalum layer over said modified first tantalum layer, wherein said second tantalum layer has a second proportion of alpha tantalum that is greater than said first proportion of alpha tantalum in said first tantalum layer.

2. The method of claim 1, wherein modifying said first tantalum layer induces a formation of an alpha phase of tantalum in at least a portion of at least said second tantalum layer.

3. The method of claim 1, wherein performing said treatment of said first tantalum layer comprises exposing said first tantalum layer to a plasma comprising at least one of nitrogen, a chemical compound comprising nitrogen, and argon.

4. The method of claim 3, wherein said plasma is substantially a nitrogen plasma.

5. The method of claim 3, wherein said plasma is an inductively coupled plasma.

6. The method of claim 1, wherein said treatment of said first tantalum layer is performed in situ.

7. The method of claim 1, wherein said semiconductor structure comprises at least one of a contact via and a trench provided in an interlayer dielectric, and wherein said diffusion barrier covers a bottom surface and sidewall surfaces of said at least one of said contact via and said trench.

8. The method of claim 7, further comprising, after the formation of said diffusion barrier, forming a seed layer over said diffusion barrier and filling said at least one of said contact via and said trench with an electrically conductive material.

9. The method of claim 1, wherein the formation of said diffusion barrier further comprises, before performing said first tantalum deposition process, forming a tantalum nitride layer over said semiconductor structure, said first tantalum layer being formed over said tantalum nitride layer.

10. A method, comprising:
forming a diffusion barrier over a semiconductor structure, the formation of said diffusion barrier comprising:
depositing a first tantalum nitride layer over said semiconductor structure, the deposition of said first tantalum nitride layer comprising performing a physical vapor deposition process that deposits tantalum nitride;
depositing a second tantalum nitride layer over said first tantalum nitride layer, the deposition of said second tantalum nitride layer comprising performing an atomic layer deposition process that deposits tantalum nitride, wherein a nitrogen content of said second tantalum nitride layer is greater than a nitrogen content of said first tantalum nitride layer; and
depositing a first tantalum layer over said second tantalum nitride layer.

11. The method of claim 10, wherein at least a portion of said first tantalum layer comprises an alpha phase of tantalum.

12. The method of claim 10, wherein said atomic layer deposition process includes at least one of a thermal atomic layer deposition process and a plasma enhanced atomic layer deposition process.

13. The method of claim 10, further comprising depositing a second tantalum layer over said first tantalum nitride layer, wherein said second tantalum nitride layer is deposited over said second tantalum layer.

14. The method of claim 10, wherein said first tantalum nitride layer is deposited directly on said second tantalum nitride layer.

15. The method of claim 10, wherein said semiconductor structure comprises at least one of a contact via and a trench formed in an interlayer dielectric, said diffusion barrier covering a bottom surface and sidewall surfaces of said at least one of said contact via and said trench, the method further comprising:
forming a seed layer over said diffusion barrier; and
performing an electroplating process to fill said at least one of said contact via and said trench with an electrically conductive material.

16. A method, comprising:
forming a diffusion barrier over a semiconductor structure, wherein forming said diffusion barrier comprises:
depositing a first tantalum layer over said semiconductor structure, said first tantalum layer having a first proportion of alpha tantalum;
performing a treatment of said first tantalum layer, wherein performing said treatment comprises modifying at least a portion of said first tantalum layer by exposing said first tantalum layer to a flow of a substantially non-ionized gas comprising nitrogen; and
after performing said treatment of said first tantalum layer, depositing a second tantalum layer over said modified first tantalum layer, wherein said at least said modified portion of said first tantalum layer induces a formation of an alpha phase of tantalum in at least a portion of at least said second tantalum layer, said second tantalum layer having a second proportion of alpha tantalum that is greater than said first proportion of alpha tantalum in said first tantalum layer.

17. The method of claim 16, wherein forming said diffusion barrier further comprises depositing a tantalum nitride layer over said semiconductor structure prior to depositing said first tantalum layer, said first tantalum layer being deposited over said tantalum nitride layer.

18. The method of claim 16, wherein said treatment of said first tantalum layer is performed in situ.

19. The method of claim 16, wherein said semiconductor structure comprises at least one of a contact via and a trench formed in an interlayer dielectric, said diffusion barrier covering a bottom surface and sidewall surfaces of said at least one of said contact via and said trench.

20. The method of claim 19, further comprising forming a seed layer over said diffusion barrier and filling said at least one of said contact via and said trench with an electrically conductive material.

* * * * *